United States Patent [19]
Ohtani et al.

[11] Patent Number: 5,239,194
[45] Date of Patent: Aug. 24, 1993

[54] SEMICONDUCTOR DEVICE HAVING INCREASED ELECTROSTATIC BREAKDOWN VOLTAGE

[75] Inventors: Satoshi Ohtani, Yokohama; Masayuki Yoshida; Nobutaka Kitagawa, both of Kawasaki; Tomotaka Saito, Yokohama, all of Japan

[73] Assignee: Kabushiki Kaisha Toshiba, Kawasaki, Japan

[21] Appl. No.: 661,816

[22] Filed: Feb. 28, 1991

[30] Foreign Application Priority Data

Mar. 2, 1990 [JP] Japan .................. 2-49461

[51] Int. Cl.⁵ .................. H01L 29/10; H01L 29/68; H01L 27/02; H01L 27/10
[52] U.S. Cl. .................. 257/360; 257/355; 257/356; 257/363
[58] Field of Search .......... 357/23.3, 23.4, 42, 357/45, 23.5

[56] References Cited

U.S. PATENT DOCUMENTS

| | | | |
|---|---|---|---|
| 4,656,492 | 4/1987 | Sunami et al. | 357/23.3 |
| 4,734,752 | 3/1988 | Liu et al. | 357/23.4 |
| 4,918,501 | 4/1990 | Komori et al. | 357/23.3 |

FOREIGN PATENT DOCUMENTS

| | | | |
|---|---|---|---|
| 0114491 | 1/1984 | European Pat. Off. | 357/23.3 |
| 0189914 | 1/1986 | European Pat. Off. | |
| 0217525 | 8/1986 | European Pat. Off. | |
| 61-216477 | 9/1986 | Japan | |
| 0122175 | 5/1988 | Japan | 357/23.3 |

OTHER PUBLICATIONS

Patent Abstracts of Japan vol. 5, No. 137 (E-72) (809) Aug. 29, 1981 & JP-A-56 71975 (Matsushita) Jun. 15, 1981.

*Primary Examiner*—Rolf Hille
*Assistant Examiner*—Wael Fahmy
*Attorney, Agent, or Firm*—Finnegan, Henderson, Farabow, Garrett & Dunner

[57] ABSTRACT

A semiconductor substrate has a plurality of MOS transistors formed therein. Each of the transistors comprises high density diffusion regions having high impurity density and serving as source and drain, low density diffusion regions having low impurity density and extending in contact with the high density diffusion regions, respectively, a channel region formed between the low density diffusion regions, and a gate formed above the substrate and insulated from the channel region. One of the transistors has its drain connected to an input/output terminal. The low density diffusion region of the one has impurity density higher than that of the other. The channel length of the one is greater than that of the other.

10 Claims, 6 Drawing Sheets

FIG. 6C
$3 \times 10^{19} cm^{-3}$

FIG. 6B
$3 \times 10^{18} cm^{-3}$

× BREAKDOWN

FIG. 6A
$3 \times 10^{17} cm^{-3}$

SEMICONDUCTOR DEVICE HAVING INCREASED ELECTROSTATIC BREAKDOWN VOLTAGE

BACKGROUND OF THE INVENTION

1. Field of the Invention

This invention relates to a MOS type semiconductor integrated circuit device having a protection device against static electricity applied to the input or output terminal, or input/output terminal of the circuit.

2. Description of the Related Art

A MOS type semiconductor integrated circuit device incorporates a protection circuit to protect itself from the static electricity applied to its external input or output terminal or input/output terminal (hereinafter called "I/O terminal"). Most protection circuit of this type comprises elements which perform bipolar operation when the static electricity is applied, as is disclosed in, for example, U.S. Pat. No. 4,734,752.

Figure 7:
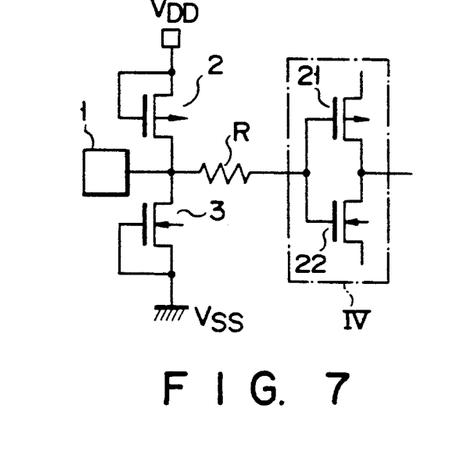
FIGS. 7-9 are circuit diagrams, showing conventional circuits.
Figure 8:
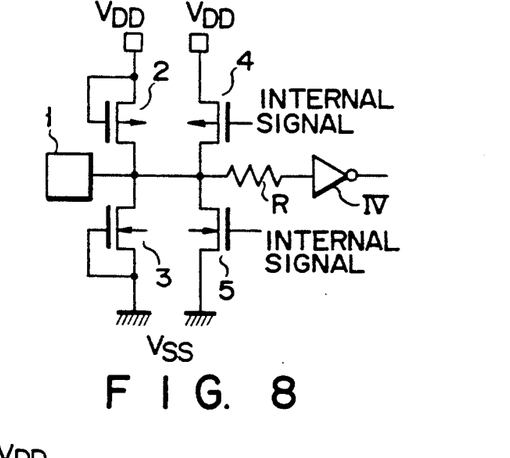
Figure 9:
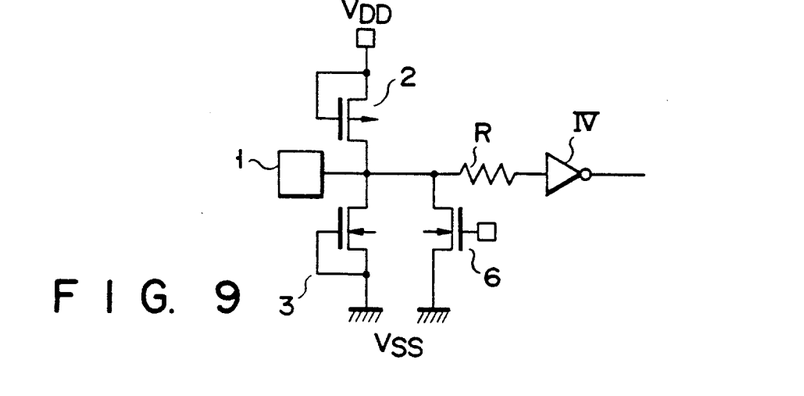

FIGS. 7-9 show protection elements which perform bipolar operation.

In FIG. 7, an I/O terminal 1 is connected to an inverter circuit IV by a resistor R. The inverter circuit IV includes transistors 21 and 22. The I/O terminal is also connected to the drains of a P-channel MOS transistor 2 and an N-channel MOS transistor 3. The sources of the transistors 2 and 3 are connected to the gates thereof, and also to source voltages $V_{DD}$ and $V_{SS}$, respectively. These transistors 2 and 3 form an input protection circuit.

The circuit shown in FIG. 8 is identical to that shown in FIG. 7, except that it further includes transistors 4 and 5. The transistors 4 and 5 have drains connected to the I/O terminal 1, sources connected to the source voltages $V_{DD}$ and $V_{SS}$, respectively, and gates connected to internal circuits (not shown). This is an input-/output circuit responsive to a signal supplied from the internal circuit.

FIG. 9 shows an input protection circuit which differs from the circuit shown in FIG. 7 in that it further incorporates a pull-down N-channel MOS transistor 6. The transistor 6 has a drain and a source connected to the I/O terminal 1 and source voltage $V_{SS}$, respectively.

The N-channel MOS transistors incorporated in the circuits shown in FIGS. 7-9 have, for example, LDD (Lightly Doped Drain) structure, and their characteristics are not deteriorated by hot carriers.

Figure 10:
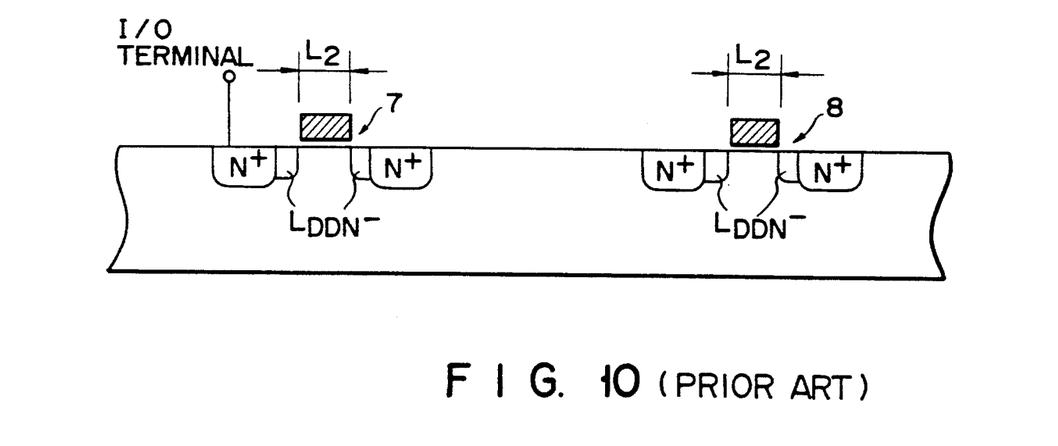
FIG. 10 is a sectional view of the conventional circuit.

FIG. 10 is a cross section showing a transistor 7 corresponding to the transistors 3, 5, and 6 shown in FIGS. 7-9, and a transistor 8 corresponding to the transistor 22. The transistors 7 and 8 have the LDD structure and a channel length $L_2$ determined by the ordinal refining technique.

Figure 11:
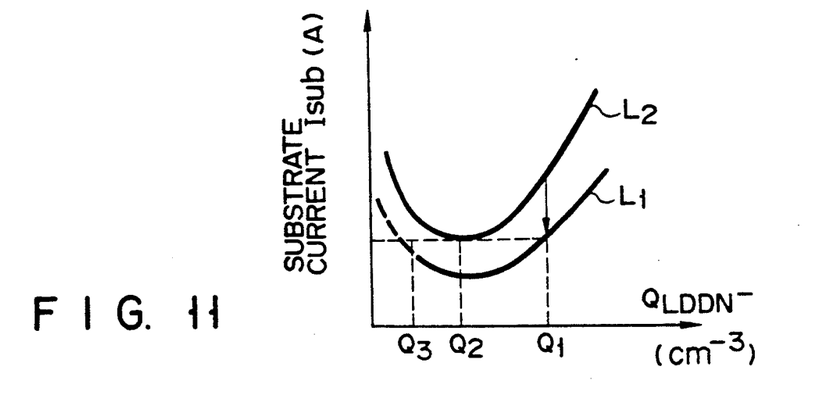
FIG. 11 is a graph, showing the relationship between the impurity density corresponding to the channel width and the substrate current.

The transistor 8 has low density diffusion regions $L_{DDN}-$. To enhance the reliability of the transistor 8 and to make it applicable to various source voltages, the impurity density (or "dose amount") of the low density diffusion regions is set at $Q_2$ ($3 \times 10^{18}$ cm$^{-3}$), so that the substrate current Isub assumes a minimum value as is shown in FIG. 11.

Figure 12:
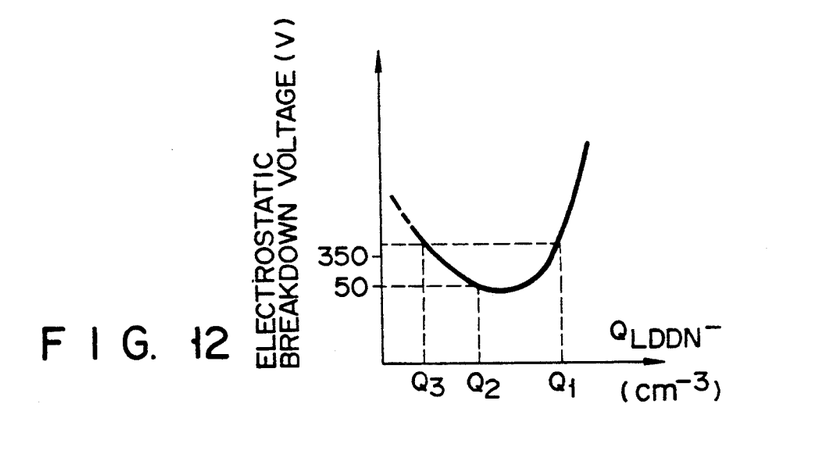
FIG. 12 is a graph, showing the relationship between the impurity density and the electrostatic breakdown voltage.

However, if the transistor 7 which forms a protection circuit is replaced with the transistor 8 used as an internal transistor not connected to the I/O terminal 1, a sufficient electrostatic breakdown voltage cannot be obtained, as is indicated by $Q_2$ in FIG. 12.

To increase the electrostatic breakdown voltage, the conventional device has transistors having large channel widths, and inevitably has a large size. The device is not suitable for high integration.

SUMMARY OF THE INVENTION

It is the object of the invention to provide a semiconductor device which has a sufficient electrostatic breakdown voltage and high reliability, and also is suitable for high integration.

To attain the object, the device of the present invention comprises:

a first insulated-gate field effect transistor including a high density diffusion region having high impurity density and disconnected from an external terminal, and a low density diffusion region having low impurity density and extending in contact with the high density diffusion region; and a second insulated-gate field effect transistor including a high density diffusion region having high impurity density and connected to the external terminal, and a low density diffusion region having low impurity density and extending in contact with the high density diffusion region, the impurity density of the low density diffusion region being different between the firs and second insulated-gate field effect transistors.

The present invention is featured in that the impurity density of the low density diffusion region is different between the transistor connected to an external terminal and that disconnected therefrom. By virtue of the feature, the transistor is connected to the external terminal can have an increased electrostatic breakdown voltage, and further the semiconductor elements can be made compact.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

This invention will now be explained with reference to the accompanying drawings showing an embodiment thereof.

Figure 1:
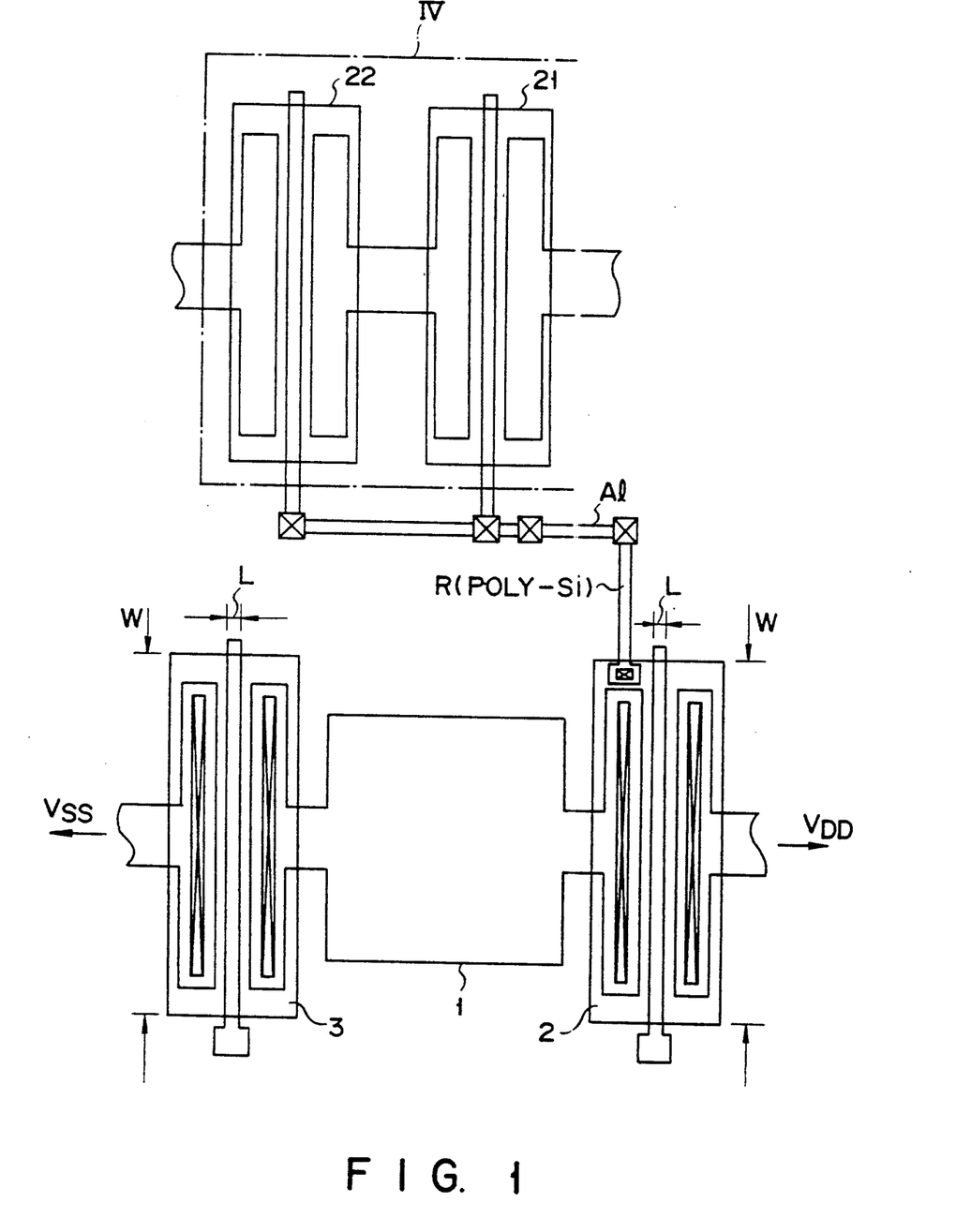
FIGS. 1 and 2 are pattern plan views, showing essential parts of circuits to which the present invention is applied.
Figure 2:
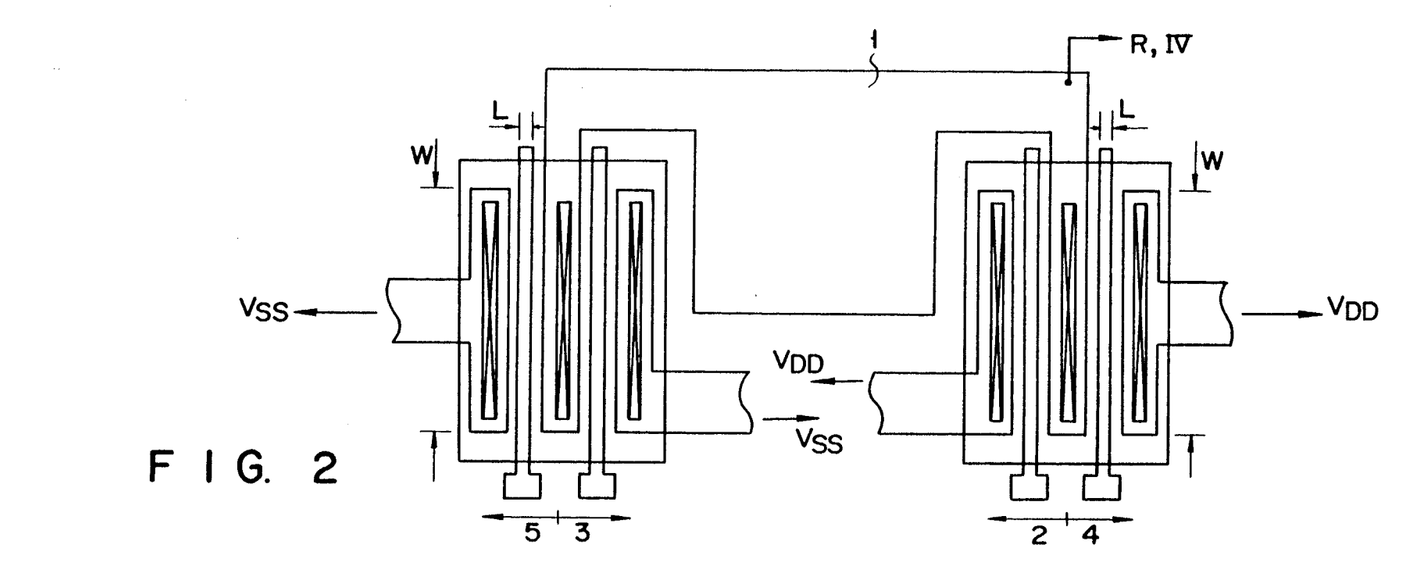

FIGS. 1 and 2 show circuits similar to those shown in FIGS. 7 and 8, respectively. A circuit similar to that shown in FIG. 9 is omitted, since it is identical to that shown in FIG. 1 or FIG. 7, except that it further incorporates the transistor 6. In FIGS. 1 and 2, like reference numeral designates like element shown in FIGS. 7 and 8

Figure 3:
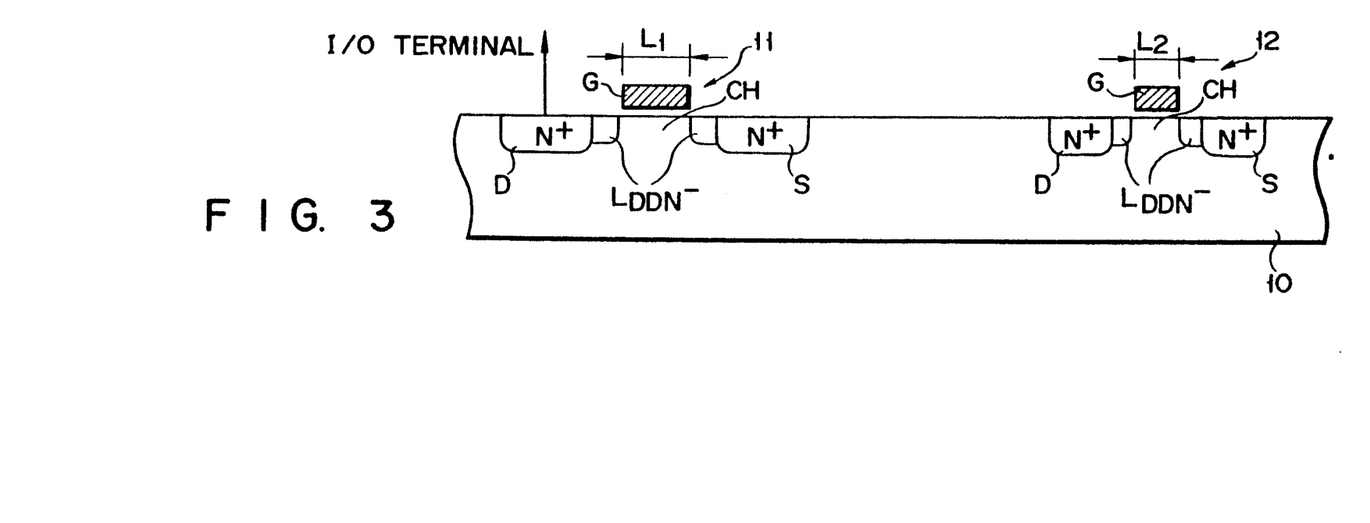
FIG. 3 is a sectional view, showing an embodiment of the present invention.

In FIG. 3, an N-channel MOS transistor 11 formed in a silicon substrate 10 corresponds to N-channel transistors 3, 5, and 6 (FIGS. 1, 2, and 7-9) which have drains connected to an I/O terminal 1. An N-channel MOS transistor 12 corresponds to transistor 22 (FIG. 1) having a drain disconnected from the I/O terminal 1 and forming e.g. an inverter circuit IV. These transistors 11 and 12 have a LDD structure. Specifically, high density diffusion regions N+ serving as the source and drain regions S and D of the transistors 11 and 12 are formed in the substrate 10, and low density diffusion regions $L_{DDN}-$ are formed in the same and extend in contact with the high density diffusion regions, respectively. Further, channel regions CH are formed between adjacent low density diffusion regions $L_{DDN}-$, and gates G are formed above the substrate 10 at locations corresponding to the channel regions CH, with an oxide film (not shown) interposed between themselves and the substrate. The channel length $L_1$ of the transistor 11 is greater than that $L_2$ of the transistor 12.

In this embodiment, the dose amount of the low density diffusion region $L_{DDN}-$ of the transistor 11 differs from that of the transistor 12, which increases the electrostatic breakdown voltage without increasing the channel width, resulting in a highly integrated semiconductor device. Specifically, the breakdown voltage is increased by setting the dose amount ($Q_1$) of the low density diffusion region of the transistor 11 at a value falling within a range of $3 \times 10^{19}$ cm$^{-3}$ to $3 \times 10^{20}$ cm$^{-3}$. If a source voltage is, for example, 3 V, and hence the substrate current is small, the electrostatic breakdown voltage is increased by setting the dose amount ($Q_3$) of the low density diffusion regions at a value falling within a range of from less than $3 \times 10^{17}$ cm$^{-3}$ to more than 0. In the present embodiment employing 1.2 $\mu$m process, the dose amount ($Q_1$) for the transistor 11 is set at $3 \times 10^{19}$ cm$^{-3}$, while the dose amount ($Q_2$) for the transistor 12 is set at $3 \times 10^{18}$ cm$^{-3}$.

To make, for example, the dose amount for the transistor 11 larger than that for the transistor 12, at first, such an amount of ionized impurity as makes the low intensity diffusion region of the transistor 12 have a desired dose amount, is dosed into both low density diffusion regions of the transistors 11 and 12, and then impurity dose is continued into the low density diffusion regions of the transistor 11 only.

As is shown in FIG. 12, the electrostatic breakdown voltage can be increased by increasing or decreasing the impurity density $Q_{LDDN}-$ of the low density diffusion region $L_{DDN}-$, since the transistor employed in the embodiment approaches the conventional one having no diffusion regions $L_{DDN}-$ by doing so.

In the manufacturing process of a MOS transistor, the polysilicon gate of the transistor is formed by patterning, and thereafter an edge portion of the gate bottom is oxidized due to post oxidation in the gate width direction. This oxidized portion is called "gate bird's beak", and has notches formed therein. These notches seem to correspond to the grain boundary of polysilicon.

Figure 4:
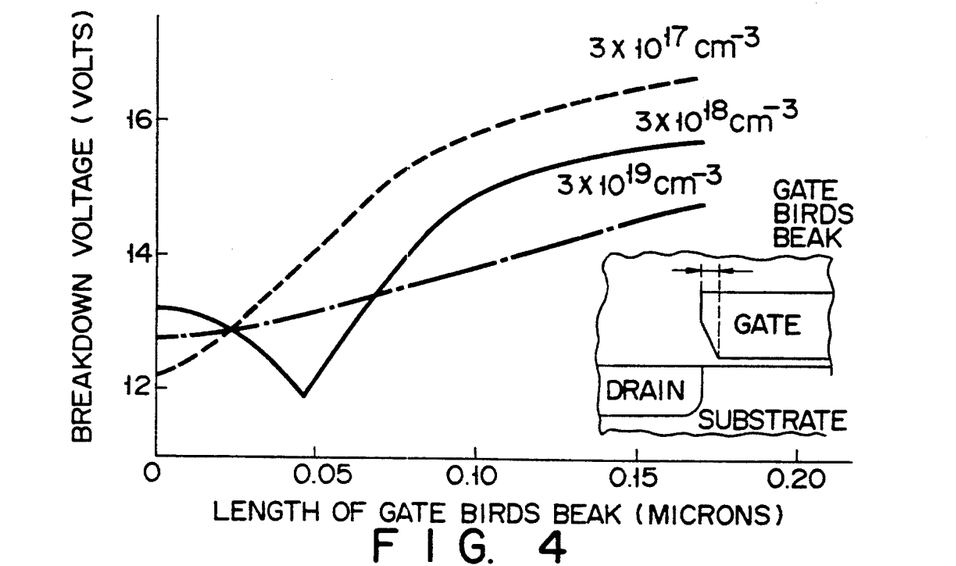
FIG. 4 is a graph, showing the relationship between the impurity density of a low density diffusion region $L_{DDN}-$ and the electric field.

FIG. 4 shows the relationship between that length of the gate bird's beak measured in the gate length direction and the breakdown voltage. As can be understood from the figure, the breakdown voltage depends upon the impurity density $QL_{DDN}-$ of the low density diffusion region $L_{DDN}-$. In a case where the density is $3 \times 10^{19}$ cm$^{-3}$ or $3 \times 10^{17}$ cm$^{-3}$, the breakdown voltage increases in accordance with the length of the gate bird's beak, whereas in a case where the density is $3 \times 10^{18}$ cm$^{-3}$, the breakdown voltage assumes a minimum value when the gate bird's beak is 0.05 $\mu$m.

Figure 5:
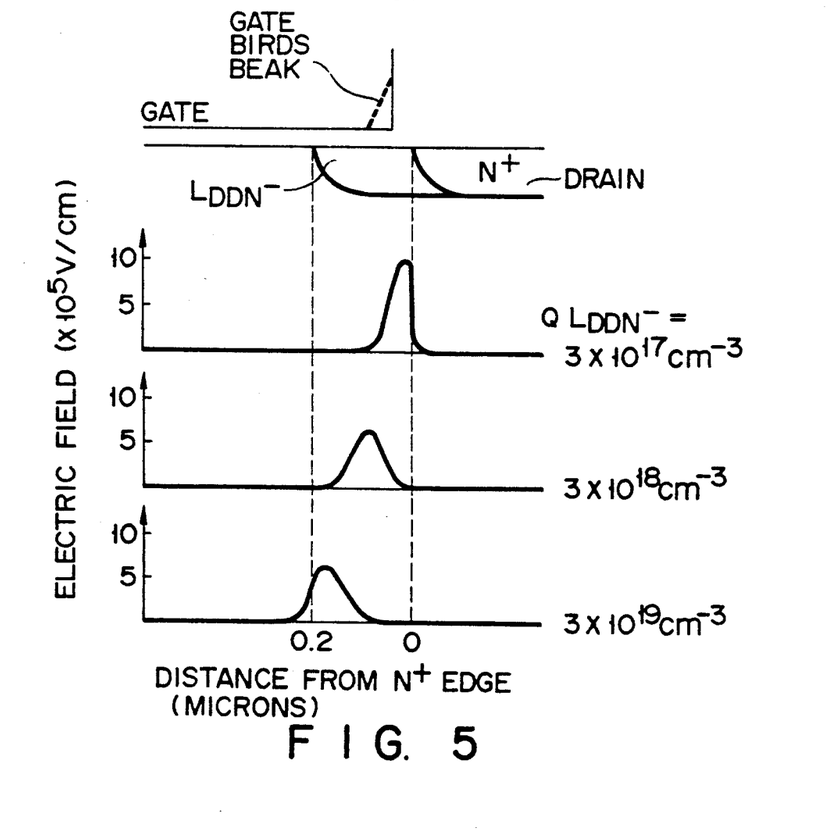
FIG. 5 is a graph, showing the relationship between the gate bird's beak and the breakdown voltage.

FIG. 5 shows the relationship between the impurity density $QL_{DDN}-$ and the peak position of the electric field. As is shown in the figure, the peak position of the electric field relative to the gate varies depending upon the impurity density. If the impurity density $QL_{DDN}-$ is $3 \times 10^{19}$ cm$^{-3}$ and $3 \times 10^{17}$ cm$^{-3}$, the peak position of the electric field appears 0.15 $\mu$m inside and 0.02 $\mu$m outside the gate edge, respectively. In these cases, breakdown occurs in a large area, as is shown in FIGS. 6A and 6C (in which symbol × designates the position in which the breakdown occurs).

Figure 6A:
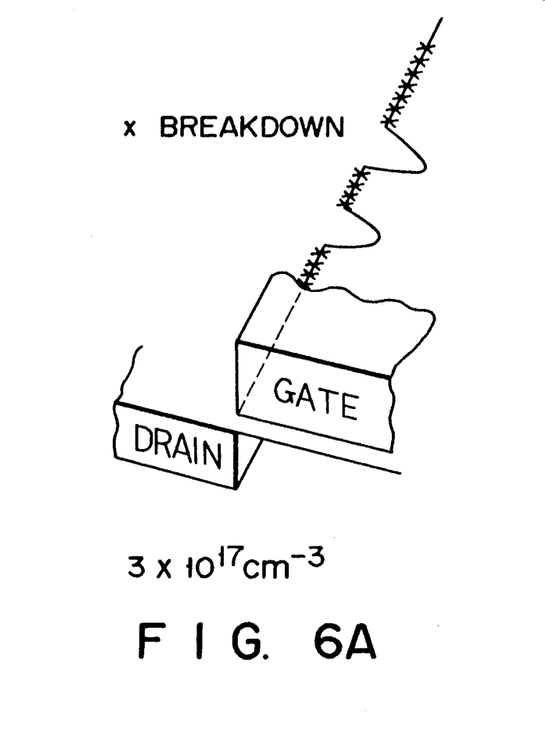
FIGS. 6A-6C are views, showing the relationship between the impurity density of the low density diffusion region $L_{DDN}-$ and the breakdown position.
Figure 6B:
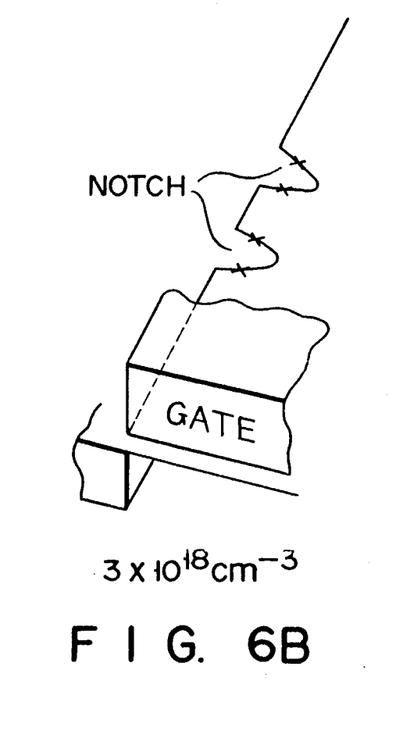

On the other hand, if the impurity density $QL_{DDN}-$ is $3 \times 10^{18}$ cm$^{-3}$, the peak position of the electric field appears at a location 0.05 $\mu$m remote from the gate edge, and breakdown occurs in edges of the notches formed in the gate as shown in FIG. 6B.

Figure 6C:
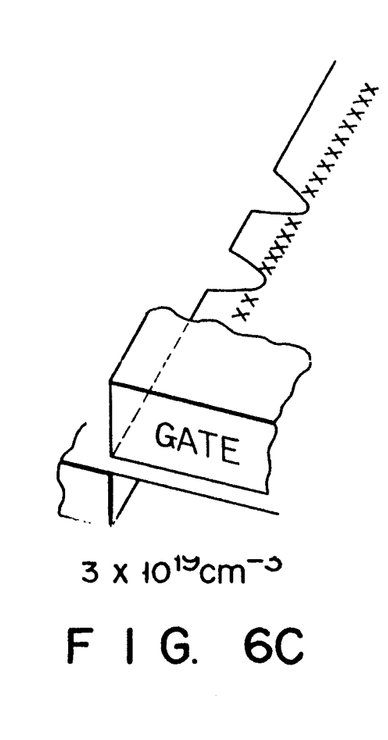

When the breakdown occurs in a large area, as is shown in FIGS. 6A and 6C, the transistor will not be broken, since the amount of current per unit area is small. In the case of FIG. 6B, however, the amount of current per unit are is so large that the transistor will be broken.

Thus, the electrostatic breakdown voltage can be increased by making the impurity density of the low den diffusion regions $L_{DDN}-$ of the transistor 11 lower or higher than that of the transistor 12.

Further, if the impurity density $Q_1$ of the transistor 11 is higher than that $Q_2$ of the transistor 12, and also the transistors 11 and 12 have the same channel length $L_2$, the substrate current Isub of the transistor 11 is larger than that of the transistor 12, as is shown in FIG. 11. In general, the reliability level of a transistor is estimated by a variation in its threshold voltage Vth due to occurrence of hot carriers, a deterioration in its conductance gm, and the like. In this embodiment, the reliability level is measured approximately by the substrate current Isub. Since the reliability depends upon the impurity density $QL_{DDN}-$ and also the channel length L, sufficient reliability can be obtained by lengthening the channel length L in a case where the reliability is lowered by increasing or decreasing the impurity density.

As is indicated by curve $L_1$ in FIG. 11, to enhance the reliability of the transistor 11, if the impurity density is $Q_1$, the channel length of the transistor 11 is made greater than that $L_2$ of the transistor 12 such that the substrate current Isub of the transistor 11 is reduced and made equal to that of the transistor 12. For example, the channel length of the transistor 11 is 1.2 $\mu$m or more against 0.8 $\mu$m for the transistor 12, 1.5 $\mu$m or more against 1.0 $\mu$m, and 1.9 $\mu$m or more against 1.2 $\mu$m.

Lengthening only the channel of a transistor connected to the I/O terminal 1 has no influence upon high integration of semiconductor elements. Though in this case, the output current decreases, this current decrease does not become a problem in practice since the device is designed to compensate for the decrease.

Although in the embodiment, the invention is applied to N-channel MOS transistors, it is also applicable to P-channel MOS transistors.

The invention need not be applied to all transistors connected to the I/O terminal, but may be applied to some of them.

The same advantage as the present invention can be also obtained by modifying the circuit shown in FIG. 8 such that it comprises the driving transistors 4 and 5 only, and the transistor 5 has a drain-side low density diffusion region of an impurity density equal to that of the low density diffusion region of a transistor disconnected from the I/O terminal 1 (e.g. a transistor included in the inverter circuit).

Similarly, the same advantage cannot be lost even by modifying the circuit shown in FIG. 9 such that the transistor 6 has an impurity density equal to that of the low density diffusion region of a transistor disconnected from the I/O terminal 1 (e.g. a transistor included in the inverter circuit). That is, a desired breakdown voltage can be obtained by setting the channel width W of the transistor 6 larger than that of the transistors 2 and 3 connected to the I/O terminal 1.

Further, in the embodiment, the invention is applied to LDD type transistors, but it may be applied to double-diffusion type transistors which have a high breakdown voltage.

Figure 13:
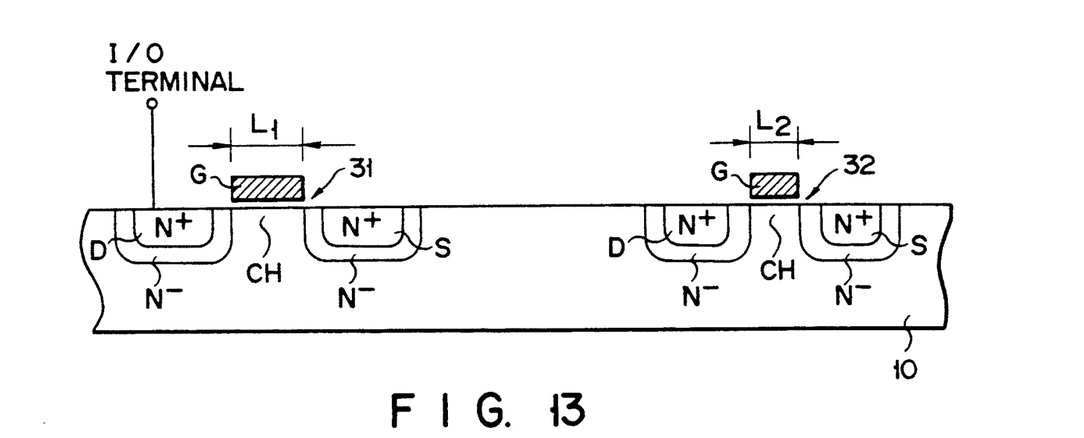
FIG. 13 is a sectional view, showing double-diffusion type transistors to which the present invention is applied.

FIG. 13 shows double-diffusion type transistors. Also in this case, the semiconductor device can have an increased electrostatic breakdown voltage by making the impurity density of low density diffusion regions N− of a transistor 31 lower or higher than that of a transistor 32.

It is needless to say that various changes and modifications may be made without departing from the spirit and scope of the invention.

What is claimed is:

1. A semiconductor device comprising:
a terminal for external connection;
a first circuit comprising at least one insulated-gate field effect transistor having a drain portion coupled to the terminal, the transistor of the first circuit including a high density diffusion region having a high impurity density and an impurity diffusion region having a lower impurity density which extends in contact with the high density diffusion region; and
a second circuit comprising at least one insulated-gate field effect transistor having a gate portion coupled to the terminal, the transistor of the second circuit including a high density diffusion region having a high impurity density and an impurity diffusion region having a lower impurity density which extends in contact with the high density diffusion region of that transistor, the impurity density of the impurity diffusion region in the insulated-gate field effect transistor of the first circuit being higher than the impurity density of the impurity diffusion region in the insulated-gate field effect transistor of the second circuit.

2. The semiconductor device according to claim 1, wherein the impurity diffusion regions have a Lightly Doped Drain structure.

3. The semiconductor device according to claim 1, wherein the impurity diffusion regions have a double-diffusion structure.

4. The semiconductor device according to claim 1, wherein the insulated-gate field effect transistor of the first circuit has a channel length greater than that of the insulated-gate field effect transistor of the second circuit.

5. A semiconductor device comprising:
a terminal for external connection;
a first circuit comprising at least one insulated-gate field effect transistor having a drain portion coupled to the terminal, the transistor of the first circuit including a high density diffusion region having a high impurity density and an impurity diffusion region having a lower impurity density which extends in contact with the high density diffusion region; and
a second circuit comprising at least one insulated-gate field effect transistor having a gate portion coupled to the terminal, the transistor of the second circuit including a high density diffusion region having a high impurity density and an impurity diffusion region having a lower impurity density which extends in contact with the high density diffusion region of that transistor, the impurity density of the impurity diffusion region in the insulated-gate field effect transistor of the first circuit being higher than the impurity density of the impurity diffusion region in the insulated-gate field effect transistor of the second circuit, and the impurity density of the impurity diffusion region of the insulated-gate field effect transistor of the first circuit falling within a range of $3 \times 10^{19}$ cm$^{-3}$ to $3 \times 10^{20}$ cm$^{-3}$.

6. The semiconductor device according to claim 4, wherein the channel length of the insulated-gate field effect transistor of the first circuit is 1.2 $\mu$m or more, 1.5 $\mu$m or more, or 1.9 $\mu$m or more against 0.8 $\mu$m, 1.0 $\mu$m, or 1.2 $\mu$m for the channel length of the insulated-gate field effect transistor of the second circuit, respectively.

7. A semiconductor device comprising:
a terminal for external connection;
a first circuit comprising at least one insulated-gate field effect transistor having a drain portion coupled to the terminal, the transistor of the first circuit including a high density diffusion region having a high impurity density and an impurity diffusion region having a lower impurity density which extends in contact with the high density diffusion region, the impurity density of the impurity diffusion region of the insulated-gate field effect transistor of the first circuit falling within a range of $3 \times 10^{19}$ cm$^{-3}$ to $3 \times 10^{20}$ cm$^{-3}$; and
a second circuit comprising at least one insulated-gate field effect transistor having a gate portion coupled to the terminal, the transistor of the second circuit including a high density diffusion region having a high impurity density and an impurity diffusion region having a lower impurity density which extends in contact with the high density diffusion region of that transistor, the impurity density of the impurity diffusion region of the insulated-gate field effect transistor of the second circuit falling within a range of $3 \times 10^{18}$ cm$^{-3}$ to $1 \times 10^{19}$ cm$^{-3}$.

8. A semiconductor device comprising:

a terminal for external connection;
a first circuit comprising at least one insulted-gate field effect transistor having a drain portion coupled to the terminal, the transistor of the first circuit including high density diffusion regions having a high impurity density, impurity diffusion regions having a lower impurity density which extend in contact with the high density diffusion regions, respectively, a channel region formed between the impurity diffusion regions, and a gate insulated from the channel regions; and
a second circuit comprising at least one insulated-gate field effect transistor, the transistor of the second circuit including high density diffusion regions having a high impurity density, impurity diffusion regions having a lower impurity density which extend in contact with the high density diffusion regions of that transistor, respectively, a channel region formed between the impurity diffusion regions of that transistor, and a gate portion coupled to the terminal and insulated from the channel region of that transistor, the impurity density of the impurity diffusion region in the insulated-gate field effect transistor of the first circuit being higher than the impurity density of the impurity diffusion region in the insulated-gate field effect transistor of the second circuit, and the channel length of the insulated-gate field effect transistor of the first circuit being greater than that of the insulated-gate field effect transistor of the second circuit.

9. A semiconductor device comprising:
a terminal for external connection;
a semiconductor substrate;
a first circuit comprising at least one insulated-gate field effect transistor having a drain portion coupled to the terminal, the transistor of the first circuit including high density diffusion regions having a high impurity density and being formed in the substrate, impurity diffusion regions having a lower impurity density which extend in the substrate in contact with the high density diffusion regions, respectively, a channel region formed between the impurity diffusion regions, and a gate formed above the substrate and insulated from the channel region; and
a second circuit comprising at least one insulated-gate field effect transistor, the transistor of the second circuit including high density diffusion regions having a high impurity density and being formed in the substrate, impurity diffusion regions having a lower impurity density and extending in the substrate in contact with the high density diffusion regions of that transistor, respectively, a channel region formed between the impurity diffusion regions of that transistor, and a gate portion coupled to the terminal of that transistor, formed above the substrate, and insulated from the channel region of that transistor, the impurity density of the impurity diffusion region in the insulated-gate field effect transistor of the first circuit being higher than the impurity density of the impurity diffusion region in the insulated-gate field effect transistor of the second circuit, and the channel length of the insulated-gate field effect transistor of the first circuit being greater than that of the insulated-gate field effect transistor of the second circuit.

10. A semiconductor device comprising:
a terminal for external connection;
a first circuit comprising at least one insulated-gate field effect transistor having a drain portion coupled to the terminal, the transistor of the first circuit including a high density diffusion region having a high impurity density and an impurity diffusion region having a lower impurity density which extends in contact with the high density diffusion region; and
a second circuit comprising at least one insulated-gate field effect transistor, the transistor of the second circuit including a high density diffusion region having a high impurity density and an impurity diffusion region having a lower impurity density which extends in contact with the high density diffusion region of that transistor, the impurity density of the impurity diffusion region in the insulated-gate field effect transistor of the first circuit being higher than the impurity density of the impurity diffusion region in the insulated-gate field effect transistor of the second circuit, and the impurity density of the impurity diffusion region in the insulated-gate field effect transistor of the second circuit being set in such a manner that an electrostatic breakdown uniformly occurs in a gate width direction.

* * * * *

UNITED STATES PATENT AND TRADEMARK OFFICE
CERTIFICATE OF CORRECTION

PATENT NO. : 5,239,194
DATED : August 24, 1993
INVENTOR(S) : Satoshi Ohtani et al.

It is certified that error appears in the above-indentified patent and that said Letters Patent is hereby corrected as shown below:

Claim 8, column 7, line 2, change "insulted" to --insulated--.

Signed and Sealed this

Twenty-seventh Day of September, 1994

Attest:

BRUCE LEHMAN

Attesting Officer       Commissioner of Patents and Trademarks